US010090331B2

(12) United States Patent
Fan

(10) Patent No.: US 10,090,331 B2
(45) Date of Patent: Oct. 2, 2018

(54) DOUBLE-SIDE DISPLAY, DISPLAY MODULE AND TFT ARRAY SUBSTRATE THEREOF

(71) Applicant: Shenzhen China Star Optoelectronics Technology Co., Ltd., Shenzhen, Guangdong (CN)

(72) Inventor: Yong Fan, Guangdong (CN)

(73) Assignee: Shenzhen China Star Optoelectronics Technology Co., Ltd, Shenzhen, Guangdong (CN)

( * ) Notice: Subject to any disclaimer, the term of this patent is extended or adjusted under 35 U.S.C. 154(b) by 199 days.

(21) Appl. No.: 15/109,642

(22) PCT Filed: Jun. 12, 2016

(86) PCT No.: PCT/CN2016/085463
§ 371 (c)(1),
(2) Date: Jul. 3, 2016

(87) PCT Pub. No.: WO2017/193439
PCT Pub. Date: Nov. 16, 2017

(65) Prior Publication Data
US 2018/0149897 A1 May 31, 2018

(30) Foreign Application Priority Data
May 11, 2016 (CN) .......................... 2016 1 0311100

(51) Int. Cl.
*H01L 27/12* (2006.01)
*G02F 1/1368* (2006.01)
(Continued)

(52) U.S. Cl.
CPC ........ *H01L 27/1222* (2013.01); *G02F 1/1368* (2013.01); *G02F 1/13439* (2013.01);
(Continued)

(58) Field of Classification Search
CPC .... H01L 29/4908; H01L 29/42384–29/42392;
(Continued)

(56) References Cited

U.S. PATENT DOCUMENTS 8,722,442 B2 * 5/2014 Kim .................... H01B 1/04
257/102
9,477,128 B2 * 10/2016 Ruoff .................. G02F 1/155
(Continued)

FOREIGN PATENT DOCUMENTS

CN 102386296 A 3/2012
CN 104576525 A 4/2015
(Continued)

*Primary Examiner* — Scott B Geyer
(74) *Attorney, Agent, or Firm* — Andrew C. Cheng

(57) ABSTRACT

The disclosure provides a double-side display, a display module and a TFT array substrate thereof, the TFT substrate includes two graphene display units disposed opposite and a reflective layer disposed between the two graphene display units. Compared with a conventional technique, according to the double-side display, the display module and the TFT array substrate thereof, the graphene display units are disposed on the two sides of the reflective layer respectively to prevent influence between light of the two sides of the reflective layer, brightness of two display units is improved due to reflective light from the reflective layer; the structure of the double-side display is simpler, and the volume is reduced significantly, which are benefit for thinning and lightening the double-side display.

20 Claims, 3 Drawing Sheets

(51) Int. Cl.
*G02F 1/1333* (2006.01)
*G02F 1/1335* (2006.01)
*G02F 1/1343* (2006.01)
*H01L 33/00* (2010.01)
*H01L 33/26* (2010.01)
*H01L 29/49* (2006.01)

(52) U.S. Cl.
CPC .. *G02F 1/133305* (2013.01); *G02F 1/133553* (2013.01); *G02F 1/134309* (2013.01); *H01L 29/4966* (2013.01); *H01L 33/0041* (2013.01); *H01L 33/26* (2013.01); *G02F 1/133345* (2013.01); *G02F 2001/133342* (2013.01)

(58) Field of Classification Search
CPC .... H01L 29/78645–29/78648; H01L 29/8126; H01L 29/78666; H01L 29/78675; H01L 29/66757; H01L 29/78669; H01L 29/78678; H01L 29/66765; H01L 27/1222; H01L 29/4966; H01L 33/0041; H01L 33/26; G02F 1/1368; G02F 1/133305; G02F 1/133553; G02F 1/134309; G02F 1/13439; G02F 1/133345; G02F 2001/133342
See application file for complete search history.

(56) References Cited

U.S. PATENT DOCUMENTS

| | | |
|---|---|---|
| 2006/0050199 A1 | 3/2006 | Hsu et al. |
| 2009/0236609 A1* | 9/2009 | de Heer ................ H01L 21/321 257/77 |
| 2016/0254336 A1 | 9/2016 | Zhang et al. |
| 2017/0256679 A1* | 9/2017 | Fan .......................... H01L 33/26 |

FOREIGN PATENT DOCUMENTS

| | | |
|---|---|---|
| CN | 204595384 A | 8/2015 |
| KR | 20080026853 A | 3/2008 |

\* cited by examiner

DOUBLE-SIDE DISPLAY, DISPLAY MODULE AND TFT ARRAY SUBSTRATE THEREOF

FIELD OF THE DISCLOSURE

The disclosure relates to a double-side display technical field, and more particularly to a double-side display, a display module and a TFT array substrate thereof.

BACKGROUND OF THE DISCLOSURE

A conventional double-side liquid crystal display needs to apply two liquid crystal display panels and corresponding backlight due to the panels are transmission liquid crystal panels, for which is thick and power consuming, especially when it is display with a bright circumstance, the display panel can be seen clearly with high brightness, thereby high brightness is necessary for display backlight, which causes high power consumption of the display, performing poor in energy-saving and emission-reduction. As shown in FIG. 1, FIG. 1 is a schematic structural view of a conventional double-side liquid crystal display.

SUMMARY OF THE DISCLOSURE

Embodiments of the disclosure provide a double-side display, a display module and a TFT array substrate thereof to solve problems of structural complicacy, heaviness and considerable power consumption of a convention double-side display.

To solve the problems above, an embodiment of the disclosure provides a TFT array substrate with a function of displaying in two sides, the TFT substrate includes two graphene display units disposed opposite and a reflective layer disposed between the two graphene display units.

According to a preferred embodiment of the disclosure, the graphene display units respectively include: a substrate; an insulating layer disposed on the substrate; a light-emitting layer, a source electrode and a drain electrode disposed on the insulating layer, the source electrode and the drain electrode are in contact with the light-emitting layer respectively, a dielectric layer covering the light-emitting layer, the source electrode and the drain electrode; and gate electrodes disposed on the dielectric layer; each of the gate electrodes of the two graphene display units is attached on two sides of the reflective layer respectively, structures of the two graphene display units are symmetrical with respect to the reflective layer.

According to a preferred embodiment of the disclosure, the gate electrodes are made out of graphene oxide.

According to a preferred embodiment of the disclosure, the light-emitting layer, the source electrode and the drain electrode are made out of reduced graphene oxide.

According to a preferred embodiment of the disclosure, an oxygen content of the reduced graphene oxide in the source electrode and the drain electrode is less than that of the reduced graphene oxide in the light-emitting layer.

According to a preferred embodiment of the disclosure, the substrate is made out of a flexible material.

According to a preferred embodiment of the disclosure, a material of the dielectric layer is $SiO_2$ or $SiN_x$.

According to a preferred embodiment of the disclosure, a material of the insulating layer has good properties of oxygenic insulation and thermal conductivity.

To solve the technical problems above, the disclosure further provides a double-side display module, the double-side display module includes the TFT array substrate according to any embodiment of the disclosure above.

The disclosure further provides a double-side display, the double-side display includes the double-side display module described in the embodiments above.

Compared with a conventional technique, according to the double-side display, the display module and the TFT array substrate thereof of the disclosure, the graphene display units are disposed on the two sides of the reflective layer respectively to prevent influence between light of the two sides of the reflective layer, brightness of two display units is improved due to reflective light from the reflective layer; the structure of the double-side display is simpler, and the volume is reduced significantly, which are benefit for thinning and lightening the double-side display; moreover, graphene oxide is applied as the material of the light-emitting layer and electrode layers to improve drive display rate of pixels, which can improve resolution of images and reduce aliasing at the edge of a word of an image, and graphene oxide is applied as the material of the light-emitting layer and the electrode layers, according to various materials of the substrate, a flexible double-side display is possible to be produced.

BRIEF DESCRIPTION OF THE DRAWINGS

In order to clearly illustrate embodiments of the disclosure, following figures to be described in the embodiments will be briefly introduced, obviously, the drawings are merely some embodiments of the disclosure, a person skilled in the art can obtain other figures according to these figures without creation.

DETAILED DESCRIPTION OF PREFERRED EMBODIMENTS

Embodiments of the disclosure are described in detail with reference to the accompanying drawings as follows, obviously, the described embodiments are part of embodiments of the disclosure instead of all embodiments. Based on the embodiments of the disclosure, all other embodiments obtained by a person skilled in the art without creative efforts should be considered within the scope of protection of the disclosure.

Graphene with excellent properties such as hardness, high transparence (penetration rate≈97.7%), high thermal conductivity (5300 W/m·K) and high electron mobility (more than 15000 $cm^2/V·s$) has been applied in a display in recent years, especially in a touch screen (substituting a conventional transparent conductive thin film ITO) and in a LED. Graphene applied in the display field has been spread due to appearing of a graphene light-emitting element in recent years. A light-emitting diode made out of graphene can adjust color of light from the graphene light-emitting diode by the gate electrode voltage.

Figure 1:
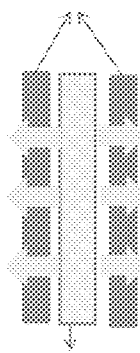
FIG. 1 is a schematic structural view of a conventional double-side liquid crystal display.
Figure 2:
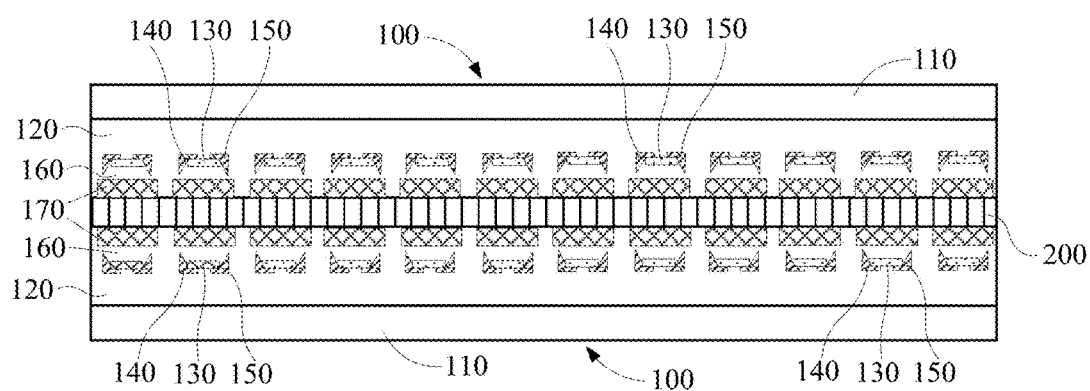
FIG. 2 is a schematic structural view of a TFT array substrate with a function of displaying in two sides according to a preferred embodiment of the disclosure.
Figure 3:
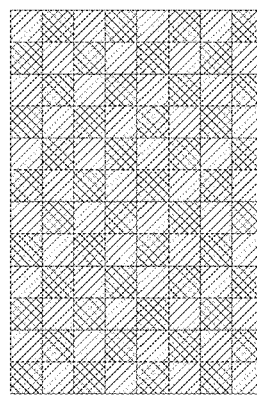
FIG. 3 is a rendering of displaying in a single side according to conventional pixel design.

Referring to FIG. 2, FIG. 2 is a schematic structural view of a TFT array substrate with a function of displaying in two sides according to a preferred embodiment of the disclosure.

The TFT array substrate includes two graphene display units 100 disposed opposite and a reflective layer 200 disposed between the two graphene display units 100.

Specifically, the two graphene display units 100 respectively include a substrate 100, an insulating layer 120, a light-emitting layer 130, a source electrode 140, a drain electrode 150, a dielectric layer 160 and gate electrodes 170.

The insulating layer 120 is disposed on the substrate 110, a material of the substrate 110 can be a rigid material with a stable size such as glass, metal, polyethylene terephthalate (PET), or a flexible material that can produce a flexible panel. The insulating layer 120 needs to have good properties of oxygenic insulation and thermal conductivity, being able to provide a thermal dissipation path.

The light-emitting layer 130, the source electrode 140 and the drain electrode 150 are disposed on the insulating layer 120, the source electrode 140 and the drain electrode 150 are in contact with the light-emitting layer 130 respectively. Preferably, the light-emitting layer 130, the source electrode 140 and the drain electrode 150 are made out of reduced graphene oxide, an oxygen content of the graphene in the light-emitting layer 130, the source electrode 140 and the drain electrode 150 is less than that of the graphene oxide in the gate electrodes 170.

The light-emitting layer 130, the source electrode 140 and the drain electrode 150 are all made out of reduced graphene oxide (RGO), but oxygen contents are different, preferably, an oxygen content of the reduced graphene oxide in the source electrode 140 and the drain electrode 150 is less than that of the reduced graphene oxide in the light-emitting layer 130. A light-emitting wavelength of the light-emitting layer 130 can be adjusted by voltages of the gate electrodes 170 continuously. The light-emitting layer 130 can be prepared by ink jet printing, roll to roll, spin coating, similarly, the source electrode 140 and the drain electrode 150 apply the same method as preparing the light-emitting layer 130, which will be skipped.

The dielectric layer 160 further covers the light-emitting layer 130, the source electrode 140 and the drain electrode 150, a material of the dielectric layer 160 can be $SiO_2$ or $SiN_x$. The gate electrodes 170 are disposed on the dielectric layer 160, a material of the gate electrodes 170 is preferably graphene oxide (GO), GO of the gate electrodes 170 can be prepared by an improved hummers method (a method generating graphene by an oxidation-reduction method), which is preparing completely oxidized graphene by partial oxidized graphene. The gate electrodes 170 can be prepared by ink jet printing, roll to roll, spin coating as well.

In the embodiment, each of the gate electrodes 170 of the two graphene display units 100 is attached on two sides of the reflective layer 200 respectively, structures of the two graphene display units 100 are symmetrical with respect to the reflective layer 200. Preferably, the reflective layer 200 is a metallic thin film, which can prevent influence between light from two sides of the light-emitting layer 200, brightness of array substrates on both sides is improved due to reflective light from the reflective layer 200.

Figure 4:
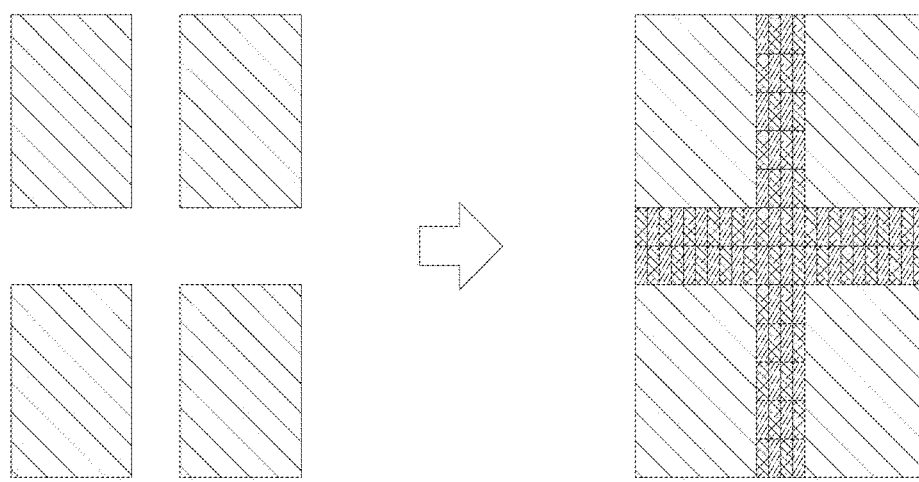
FIG. 4 is a rendering of displaying in double sides according to conventional pixel design.
Figure 5:
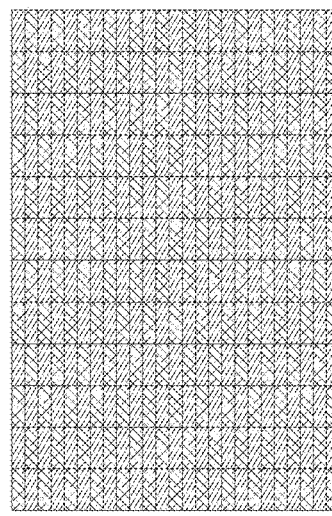
FIG. 5 is a single-side display rendering of a display applying graphene oxide according to the disclosure.
Figure 6:
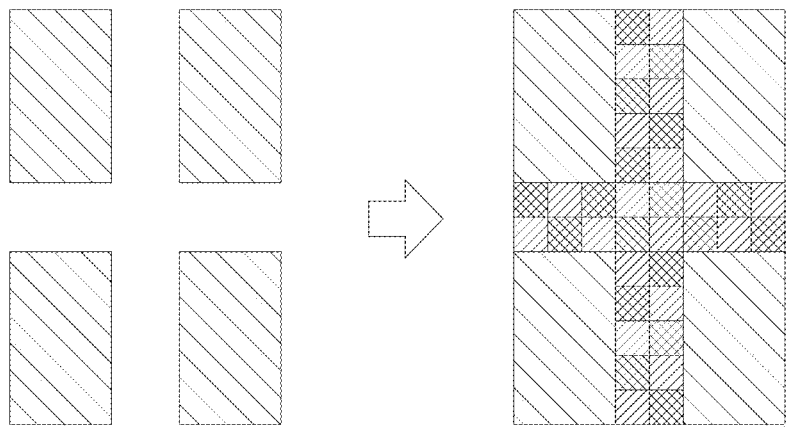
FIG. 6 is a double-side display rendering of a display applying graphene oxide according to the disclosure.

A pixel electrode is preferably driven by field sequential color, along with fast response of graphene oxide, which can improve resolution of images and reduce aliasing at the edge of a word of an image. Compared with a conventional pixel of pixel design, effects of display are improved significantly. Referring to FIG. 3 through FIG. 6, FIG. 3 is a rendering of displaying in a single side according to conventional pixel design, the black section represents an opposite pixel; FIG. 4 is a rendering of displaying in double sides according to conventional pixel design, FIG. 5 is a single-side display rendering of a display applying graphene oxide according to the disclosure, FIG. 6 is a double-side display rendering of a display applying graphene oxide according to the disclosure, obviously, effects (especially resolution of images and reduce aliasing at the edge of a word of an image) of the display according to the disclosure are improved significantly.

Furthermore, the embodiment of the disclosure further provides a double-side display module and a double-side display, the display module includes the TFT array substrate according to the embodiments of the disclosure above, details in structures can be referred to the previous embodiments.

Figure 7:
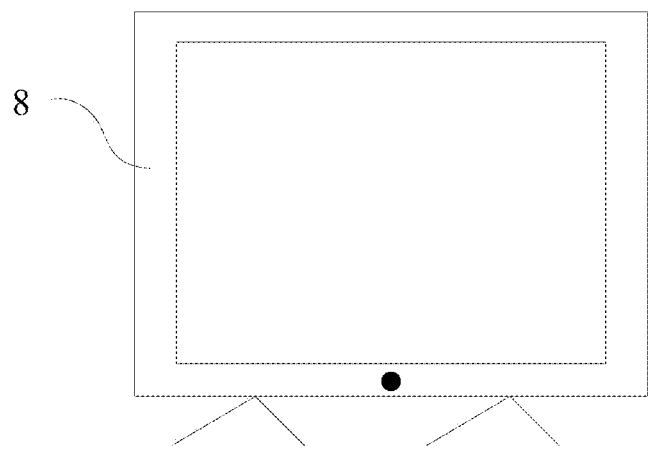
FIG. 7 is schematic structural view of a double-side display according to a preferred embodiment of the disclosure.

FIG. 7 is schematic structural view of a double-side display according to a preferred embodiment of the disclosure. The double-side display includes a housing 8 and the double-side display module in the embodiments above disposed in the housing 8. Technical properties of the double-side display module can be referred to detailed description in the embodiments above, and other structural properties of the double-side display so well known to a person skilled in the art will not be repeated.

Compared with a conventional technique, according to the double-side display, the display module and the TFT array substrate thereof of the disclosure, the graphene display units are disposed on the two sides of the reflective layer respectively to prevent influence between light of the two sides of the reflective layer, brightness of two display units is improved due to reflective light from the reflective layer; the structure of the double-side display is simpler, and the volume is reduced significantly, which are benefit for thinning and lightening the double-side display; moreover, graphene oxide is applied as the material of the light-emitting layer and electrode layers to improve drive display rate of pixels, which can improve resolution of images and reduce aliasing at the edge of a word of an image, and graphene oxide is applied as the material of the light-emitting layer and the electrode layers, according to various materials of the substrate, a flexible double-side display is possible to be produced.

Above are merely embodiments of the disclosure, which do not limit the scope of the disclosure, any modifications, equivalent replacements or improvements within the spirit and principles of the embodiments described above should be covered by the protected scope of the disclosure.

What is claimed is:

1. A TFT array substrate with a function of displaying in two sides, wherein the TFT substrate comprises two graphene display units disposed opposite and a reflective layer disposed between the two graphene display units; the graphene display units respectively comprise:
   a substrate;
   an insulating layer disposed on the substrate;
   a light-emitting layer, a source electrode and a drain electrode disposed on the insulating layer, the source electrode and the drain electrode being in contact with the light-emitting layer respectively, the light-emitting layer, the source electrode and the drain electrode being made out of reduced graphene oxide;

a dielectric layer covering the light-emitting layer, the source electrode and the drain electrode; and gate electrodes disposed on the dielectric layer, the gate electrodes being made out of graphene oxide;

each of the gate electrodes of the two graphene display units being attached on two sides of the reflective layer respectively, structures of the two graphene display units being symmetrical with respect to the reflective layer.

2. The TFT array substrate according to claim 1, wherein an oxygen content of the reduced graphene oxide in the source electrode and the drain electrode is less than that of the reduced graphene oxide in the light-emitting layer.

3. The TFT array substrate according to claim 1, wherein the substrate is made out of a flexible material.

4. The TFT array substrate according to claim 1, wherein a material of the dielectric layer is $SiO_2$ or $SiN_x$.

5. The TFT array substrate according to claim 1, wherein a material of the insulating layer has properties of oxygenic insulation and thermal conductivity.

6. A double-side display module, wherein the double-side display module comprises a TFT array substrate, the TFT array substrate comprises two graphene display units disposed opposite and a reflective layer disposed between the two graphene display units.

7. The double-side display module according to claim 6, wherein the graphene display units respectively comprise:
a substrate;
an insulating layer disposed on the substrate;
a light-emitting layer, a source electrode and a drain electrode disposed on the insulating layer, the source electrode and the drain electrode being in contact with the light-emitting layer respectively,
a dielectric layer covering the light-emitting layer, the source electrode and the drain electrode; and
gate electrodes disposed on the dielectric layer;
each of the gate electrodes of the two graphene display units being attached on two sides of the reflective layer respectively, structures of the two graphene display units are symmetrical with respect to the reflective layer.

8. The double-side display module according to claim 7, wherein the gate electrodes are made out of graphene oxide.

9. The double-side display module according to claim 7, wherein the light-emitting layer, the source electrode and the drain electrode are made out of reduced graphene oxide.

10. The double-side display module according to claim 9, wherein an oxygen content of the reduced graphene oxide in the source electrode and the drain electrode is less than that of the reduced graphene oxide in the light-emitting layer.

11. The double-side display module according to claim 7, wherein the substrate is made out of a flexible material.

12. The double-side display module according to claim 7, wherein a material of the dielectric layer is $SiO_2$ or $SiN_x$.

13. The double-side display module according to claim 7, wherein a material of the insulating layer has properties of oxygenic insulation and thermal conductivity.

14. A double-side display, wherein the double-side display comprises a double-side display module, the double-side display module comprises a TFT array substrate, the TFT array substrate comprises two graphene display units disposed opposite and a reflective layer disposed between the two graphene display units.

15. The double-side display according to claim 14, wherein the graphene display units respectively comprise:
a substrate;
an insulating layer disposed on the substrate;
a light-emitting layer, a source electrode and a drain electrode disposed on the insulating layer, the source electrode and the drain electrode being in contact with the light-emitting layer respectively;
a dielectric layer covering the light-emitting layer, the source electrode and the drain electrode; and
gate electrodes disposed on the dielectric layer;
each of the gate electrodes of the two graphene display units being attached on two sides of the reflective layer respectively, structures of the two graphene display units being symmetrical with respect to the reflective layer.

16. The double-side display according to claim 15, wherein the gate electrodes are made out of graphene oxide.

17. The double-side display according to claim 15, wherein the light-emitting layer, the source electrode and the drain electrode are made out of reduced graphene oxide.

18. The double-side display according to claim 17, an oxygen content of the reduced graphene oxide in the source electrode and the drain electrode is less than that of the reduced graphene oxide in the light-emitting layer.

19. The double-side display according to claim 15, wherein the substrate is made out of a flexible material.

20. The double-side display according to claim 15, wherein a material of the insulating layer has properties of oxygenic insulation and thermal conductivity.

* * * * *